(12) United States Patent
Mayor Miguel et al.

(10) Patent No.: US 10,097,101 B2
(45) Date of Patent: Oct. 9, 2018

(54) THREE PHASE MEDIUM VOLTAGE POWER CONVERSION SYSTEM FOR COUPLING A POWER SOURCE TO A UTILITY GRID

(71) Applicant: GAMESA INNOVATION & TECHNOLOGY, S. L., Sarriguren (Navarra) (ES)

(72) Inventors: Alvar Gonzalo Mayor Miguel, Madrid (ES); Mario Rizo Morente, Madrid (ES); Andres Agudo Araque, Madrid (ES)

(73) Assignee: GAMESA INNOVATION & TECHNOLOGY, S. L., Sarriguren (Navarra) (ES)

( * ) Notice: Subject to any disclaimer, the term of this patent is extended or adjusted under 35 U.S.C. 154(b) by 0 days.

(21) Appl. No.: 15/482,009

(22) Filed: Apr. 7, 2017

(65) Prior Publication Data

US 2017/0310233 A1    Oct. 26, 2017

(30) Foreign Application Priority Data

Apr. 21, 2016  (ES) .................................. 201600320

(51) Int. Cl.
| | |
|---|---|
| *H02M 1/12* | (2006.01) |
| *H02M 5/42* | (2006.01) |
| *H02M 1/084* | (2006.01) |
| *H03H 7/01* | (2006.01) |
| *H02M 7/5395* | (2006.01) |

(52) U.S. Cl.
CPC ............. *H02M 5/42* (2013.01); *H02M 1/084* (2013.01); *H02M 1/12* (2013.01); *H02M 7/5395* (2013.01); *H03H 7/01* (2013.01); *H03H 2007/013* (2013.01)

(58) Field of Classification Search
None
See application file for complete search history.

(56) References Cited

U.S. PATENT DOCUMENTS

| | | | | |
|---|---|---|---|---|
| 9,584,039 | B2 * | 2/2017 | Nguyen | .................. H02M 7/06 |
| 2012/0201056 | A1 * | 8/2012 | Wei | ..................... H02M 5/4585 |
| | | | | 363/37 |
| 2014/0009982 | A1 * | 1/2014 | Li | ........................... H02M 1/14 |
| | | | | 363/40 |
| 2014/0266506 | A1 * | 9/2014 | Andersson | .............. H01F 27/42 |
| | | | | 333/177 |
| 2015/0035284 | A1 * | 2/2015 | Yang | ....................... H02M 5/42 |
| | | | | 290/55 |

* cited by examiner

*Primary Examiner* — Jeffrey Gblende
(74) *Attorney, Agent, or Firm* — Ladas & Parry LLP

(57) ABSTRACT

The invention provides a three phase medium voltage power conversion system for coupling a power source to a utility grid comprising a power converter and a Notch-Filter. The switching control system of the inverter of the power converter is based on SHE-PWM patrons. The Notch-Filter is tuned to attenuate the frequency of the first harmonic that the switching control system of the inverter cannot attenuate and configured with damping means capable of smoothing the resonance frequency without affecting the notch frequency.

5 Claims, 2 Drawing Sheets

THREE PHASE MEDIUM VOLTAGE POWER CONVERSION SYSTEM FOR COUPLING A POWER SOURCE TO A UTILITY GRID

FIELD OF THE INVENTION

The invention relates to power conversion systems for coupling energy sources, particularly renewable energy sources, to utility grids.

BACKGROUND OF THE INVENTION

The conventional power conversion systems for coupling renewable energy sources to utility grids have been Low-Voltage (LV) power conversion systems (<1000 V). However, particularly in the field of wind energy and for certain types of wind turbines, Medium-Voltage (MV) power conversion systems (>1000 V) would be desirable to improve its efficiency, because less current is needed to obtain the same power level.

The switching-frequency harmonic attenuation in power conversion systems is an important performance index in order to satisfy the standards of the IEEE 1547.2-2008 and 519-1992. In MV grid-tied inverters low switching frequencies (typically lower than 1.000 Hz) are required and said standards are more difficult to be satisfied than in LV grid-tied inverters.

The invention is addressed to the solution of this problem.

BRIEF DESCRIPTION OF THE INVENTION

The invention provides a three phase MV power conversion system for coupling a power source to a utility grid comprising:

a) a power converter with a switching control system based on Selective Harmonic Elimination-Pulse With Modulation (SHE-PWM) patrons, and b) a Notch-Filter tuned to attenuate the frequency of the first harmonic that the switching control system cannot attenuate and configured with damping means capable of smoothing the resonance frequency without affecting the notch frequency.

The combination of these features allows that the switching-frequency harmonic attenuation of the power conversion system meets the standards of the IEEE 1547.2-2008 and 519-1992.

With SHE-PWM patrons the number of switching transitions within the first quarter cycle of the fundamental period is chosen to be X angles. As the theory of SHE suggests, this will allow controlling the fundamental component to the required level and eliminating the first X-1 low-order non-triple odd harmonics. The Notch-Filter is tuned at the desired frequency, normally tuned at the frequency of the first harmonics that SHE cannot remove/attenuate. To smooth its resonance frequency without affecting the notch frequency the Notch-Filter is configured with an RC parallel damper that is in parallel with the notch branch.

Other desirable features and advantages of the invention will become apparent from the subsequent detailed description of the invention and the appended claims, in relation with the enclosed drawings.

DETAILED DESCRIPTION OF THE INVENTION

Figure 1A:
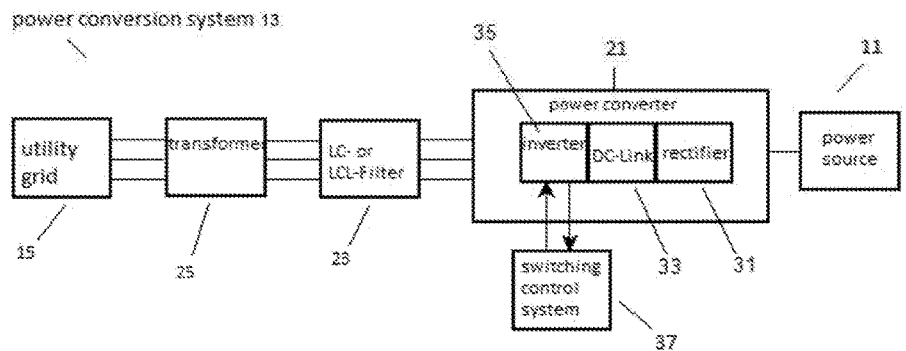
FIG. 1a is a block diagram of a typical LV three phase power conversion system for coupling a power source to a utility grid and FIG. 1b is a block diagram of a MV three phase power conversion system for coupling a power source to a utility grid according to the invention.

As shown in FIG. 1a a typical LV three phase power conversion system 13 coupling a power source 11 such as a wind turbine to a utility grid 15 comprises a power converter 21, an LC- or LCL-Filter 23 and a transformer 25.

The power converter 21 comprises a rectifier 31 coupled to the power source 11, a DC-Link 33 and an inverter 35. The switching control system 37 of the inverter 35 is based on PWM techniques and the LC- or LCL-Filter 23 is configured for high harmonic attenuation.

A similar arrangement for a MV three phase power conversion system would involve at least two problems:

The classical control techniques of the inverter such as Pulse with Modulation (PWM) present several technical issues during lower switching frequency operation.

The normal passive known damping method of a Notch-Filter, i.e. inserting a resistor in series with the capacitor branch, introduces extra power losses and the high frequency attenuation turns out to be ineffective, since both the notch frequency and the resonance frequency are damped.

Figure 1B:
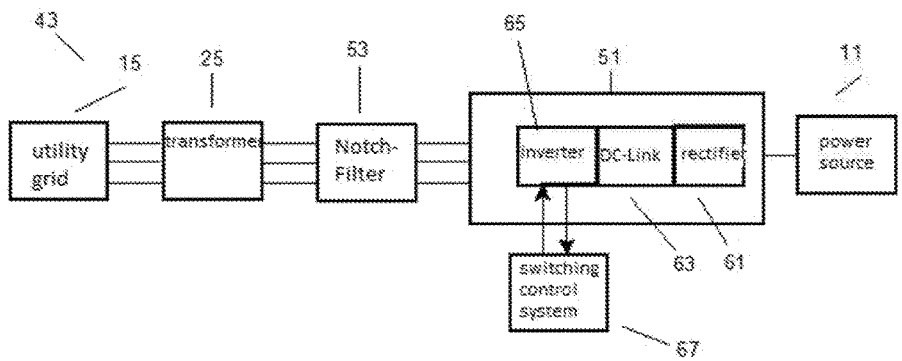

A three phase MV power conversion system 43 coupling a power source 11 to a utility grid 15 that solves that problems is shown in FIG. 1b and comprises a power converter 51, a Notch-Filter 53 (operating for instance at 3.3 Kv) and, if needed, a transformer 25 (to achieve the voltage level of the utility grid 15) coupled to the output nodes of the Notch-Filter 53.

The power converter 51 comprises a rectifier 61 coupled to the power source 11, a DC-Link 63 and an inverter 65 with a switching control system 67 based on SHE-PWM patrons in order to avoid low order switching harmonics.

The Notch-Filter 53, coupled to the output nodes of the inverter 65, shall be tuned around the frequency range of the main switching harmonics for achieving a significant attenuation of these harmonic components. With SHE-PWM patrons (see FIG. 2) the number of switching transitions within the first quarter cycle of the fundamental period is chosen to be X angles.

Figure 2:
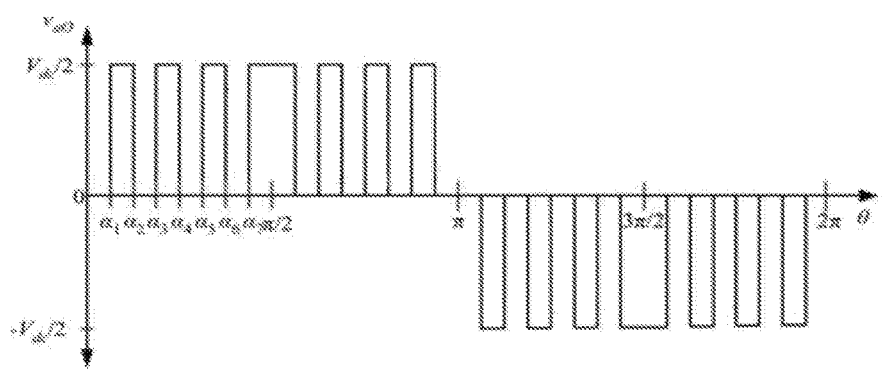
FIG. 2 shows a SHE-PWM patron with various switching angles for a selective harmonic elimination.

For MV power conversion systems normally the number of angles is chosen from 5 up to 15 (in FIG. 2 seven angles can be observed). As the theory of SHE suggests, this will allow controlling the fundamental component to the required level and eliminating the first X-1 low-order non-triple odd harmonics. The Notch-Filter 53 is therefore tuned at the desired frequency, normally the frequency of the first harmonics that SHE cannot remove/attenuate.

On the other hand, the Notch-Filter 53 is configured with an RC parallel damper that is in parallel with the notch branch. This damping technique is therefore capable of smoothing the resonance frequency without affecting the notch frequency.

Figure 3:
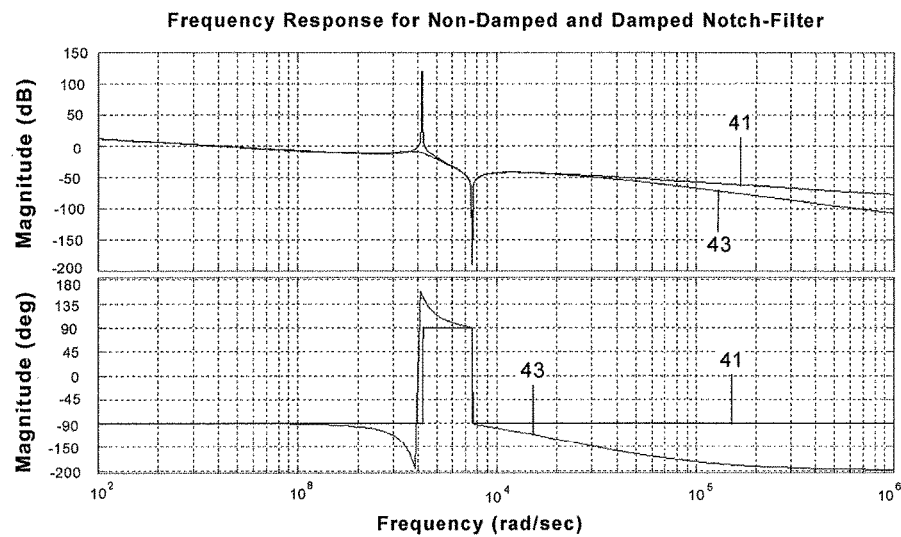
FIG. 3 illustrates the frequency response of a power conversion system with a non-damped and a damped Notch-Filter.

In FIG. 3 the Bode plots 41, 43 show the frequency response for, respectively, a non-damped and a damped Notch-Filter 53.

Figure 4:
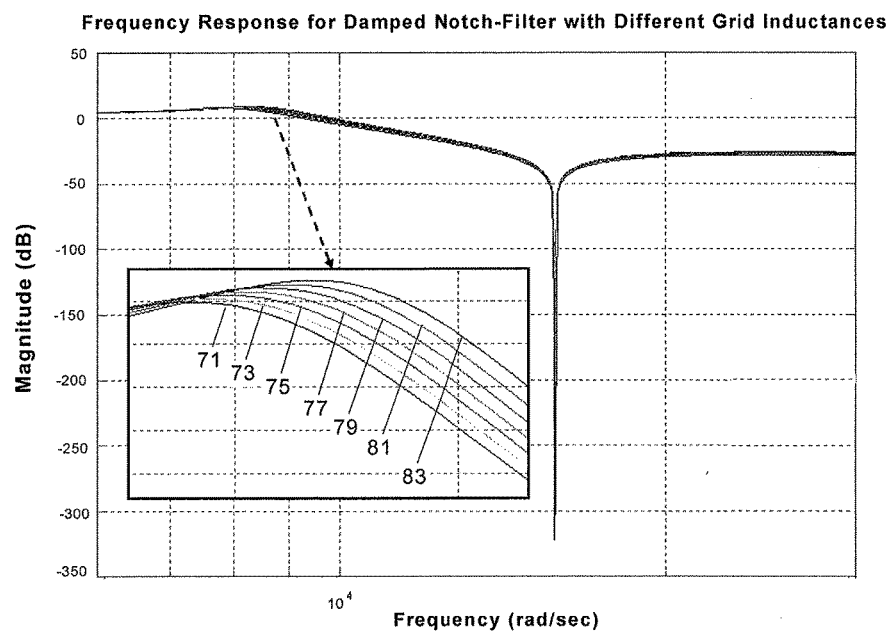
FIG. 4 illustrates the frequency response of a power conversion system with a damped Notch-Filter at different grid inductances.

In FIG. 4 the Bode plots 71, 73, 75, 77, 79, 81, 83 show the frequency response for a damped Notch-Filter 53 with, respectively, the following grid inductances 1.00, 1.05, 1.10, 1.15, 1.20, 1.25, 1.30 p.u.

In FIG. 3 and FIG. 4 it can be observed that the notch frequency becomes more effective (deeper) and the resonance frequency tends to disappear (more attenuated) with the damping means of the invention for the Notch-Filter 53.

As shown in FIG. 4, a Notch-Filter 53 having the above-mentioned damping means is quite immune compared with other grid filters to grid impedance variations.

Although the present invention has been described in connection with various embodiments, it will be appreciated from the specification that various combinations of elements, variations or improvements therein may be made, and are within the scope of the invention as defined by the appended claims.

The invention claimed is:

1. A three phase Medium-Voltage (MV) power conversion system (43) that couples a power source (11) to a utility grid (15), the system comprising:
a power converter (51) that comprises a rectifier (61) coupled to the power source (11), a DC-Link (63), and an inverter (65);
a Notch-Filter (53) coupled to output nodes of the inverter (65); and
a switching control system (67) that controls the inverter (65) based on Selective Harmonic Elimination-Pulse Width Modulation (SHE-PWM) patrons;
wherein
the Notch-Filter (53) is tuned to attenuate a frequency of a first harmonic of the inverter that the switching control system (67) of the inverter (65) cannot attenuate and is configured with damping means that smooths a resonance frequency of the Notch-Filter (53) without affecting a notch frequency.

2. The three phase MV power conversion system (43) according to claim 1, wherein the number of switching transitions of the SHE-PWM patrons within the first quarter cycle of the fundamental period is set at X angles, X being comprised between 5-15.

3. The three phase MV power conversion system (43) according to claim 1, wherein said damping means are a RC parallel damper that is in parallel with a notch branch of the Notch-Filter (53).

4. The three phase MV power conversion system (43) according to claim 1, further comprising a transformer (25) coupled to output nodes of the Notch-Filter (53).

5. The three phase MV power conversion system (43) according to claim 1, wherein the power source (11) is a wind turbine.

* * * * *